United States Patent
Ling et al.

(10) Patent No.: US 9,420,345 B2
(45) Date of Patent: *Aug. 16, 2016

(54) METHOD AND SYSTEM FOR POWER MANAGEMENT IN A FREQUENCY DIVISION MULTIPLEXED NETWORK

(71) Applicant: MaxLinear, Inc., Carlsbad, CA (US)

(72) Inventors: Curtis Ling, Carlsbad, CA (US); Timothy Gallagher, Encinitas, CA (US); Sridhar Ramesh, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/726,727

(22) Filed: Jun. 1, 2015

(65) Prior Publication Data

US 2015/0334466 A1 Nov. 19, 2015

Related U.S. Application Data

(63) Continuation of application No. 14/015,481, filed on Aug. 30, 2013, now Pat. No. 9,049,491.

(60) Provisional application No. 61/695,036, filed on Aug. 30, 2012.

(51) Int. Cl.
*H04N 7/16* (2011.01)
*H04N 21/61* (2011.01)
(Continued)

(52) U.S. Cl.
CPC ....... *H04N 21/6118* (2013.01); *H03H 17/0416* (2013.01); *H03M 1/12* (2013.01); *H03M 1/126* (2013.01); *H03M 3/496* (2013.01); *H04H 20/426* (2013.01); *H04H 20/77* (2013.01);
(Continued)

(58) Field of Classification Search
CPC .................................................. H04N 21/6118
See application file for complete search history.

(56) References Cited

U.S. PATENT DOCUMENTS 4,075,655 A * 2/1978 Iijima .................. H04N 11/046
348/394.1
4,370,643 A * 1/1983 Kitamura ............... G11C 27/02
341/123

(Continued)

OTHER PUBLICATIONS

Olshausen A. B; "Aliasing" PSC 129—Sensory Processes, Oct. 10, 2000.

*Primary Examiner* — Pankaj Kumar
*Assistant Examiner* — Timothy Newlin
(74) *Attorney, Agent, or Firm* — McAndrews, Held & Malloy Ltd.

(57) ABSTRACT

A network device may receive a signal from a headend, wherein a bandwidth of the received signal spans from a low frequency to a high frequency and encompasses a plurality of sub-bands. The network device may determine, based on communication with the headend, whether one or more of the sub-bands residing above a threshold frequency are available for carrying downstream data from the headend to the circuitry. The network device may digitize the signal using an ADC operating at a sampling frequency. The sampling frequency may be configured based on a result of the determining. When the sub-band(s) are available for carrying downstream data from the headend to the network device, the sampling frequency may be set to a relatively high frequency. When the sub-band(s) are not available for carrying downstream data from the headend to the network device, the sampling frequency may be set to a relatively low frequency.

15 Claims, 7 Drawing Sheets

(51) Int. Cl.
   *H03M 1/12* (2006.01)
   *H03H 17/04* (2006.01)
   *H03M 3/00* (2006.01)
   *H04J 1/00* (2006.01)
   *H04N 7/10* (2006.01)
   *H04H 20/42* (2008.01)
   *H04H 20/77* (2008.01)
   *H04H 40/27* (2008.01)

(52) U.S. Cl.
   CPC ....... *H04H40/27* (2013.01); *H04J 1/00* (2013.01); *H04N 7/10* (2013.01); *H04N 7/106* (2013.01)

(56) References Cited

U.S. PATENT DOCUMENTS

| | | | | |
|---|---|---|---|---|
| 4,626,827 A * | 12/1986 | Kitamura | ................ | H03M 1/00 341/110 |
| 4,763,207 A * | 8/1988 | Podolak | ................ | H03M 1/127 341/123 |
| 4,958,156 A * | 9/1990 | Ando | ................ | H03M 1/1255 341/123 |
| 4,990,911 A * | 2/1991 | Fujita | ................ | H04N 7/0102 327/113 |
| 5,302,950 A * | 4/1994 | Johnson | ................ | H03M 5/02 341/123 |
| 5,528,581 A * | 6/1996 | De Bot | ................ | H04B 7/0865 370/203 |
| 5,543,792 A * | 8/1996 | Johnson | ................ | H03M 1/12 341/123 |
| 5,619,202 A * | 4/1997 | Wilson | ................ | H03M 3/372 341/123 |
| 5,835,157 A * | 11/1998 | Miyazaki | ................ | H04N 9/642 348/555 |
| 6,035,000 A | 3/2000 | Bingham | | |
| 6,097,444 A * | 8/2000 | Nakano | ................ | G09G 5/008 348/537 |
| 6,232,760 B1 * | 5/2001 | Eckert | ................ | G01R 27/28 324/394.1 |
| 6,320,529 B1 * | 11/2001 | Yasuda | ................ | H03M 1/0668 341/143 |
| 6,483,547 B1 * | 11/2002 | Eyer | ................ | H04N 5/46 348/473 |
| 6,856,266 B2 * | 2/2005 | Clement | ................ | H03M 3/496 341/123 |
| 7,162,732 B2 * | 1/2007 | Ovadia | ................ | H04N 21/4382 348/E5.003 |
| 7,212,139 B1 * | 5/2007 | Katz | ................ | H03H 17/0219 341/122 |
| 7,492,293 B2 * | 2/2009 | Short | ................ | H03M 1/002 314/61 |
| 7,664,193 B2 * | 2/2010 | Jalali | ................ | H04L 5/023 375/267 |
| 7,787,431 B2 * | 8/2010 | Li | ................ | H04L 5/0007 370/203 |
| 8,014,477 B1 * | 9/2011 | Tsai | ................ | H03M 1/004 375/259 |
| 8,238,813 B1 * | 8/2012 | Popoli | ................ | H04B 7/18515 455/11.1 |
| 2001/0045901 A1 * | 11/2001 | Auerbach | ................ | A61B 5/0428 341/123 |
| 2002/0062394 A1 * | 5/2002 | Bunn | ................ | H03M 7/30 709/246 |
| 2002/0108120 A1 * | 8/2002 | Bahraini | ................ | H04L 12/2801 725/109 |
| 2003/0071925 A1 * | 4/2003 | Kanno | ................ | H03D 7/165 348/726 |
| 2003/0084283 A1 * | 5/2003 | Pixton | ................ | H04H 60/23 713/163 |
| 2003/0135866 A1 * | 7/2003 | Hsu | ................ | H03J 1/0075 725/111 |
| 2004/0161062 A1 * | 8/2004 | Richey | ................ | H03M 1/0614 375/344 |
| 2005/0283816 A1 * | 12/2005 | Weinstein | ................ | H04N 7/102 725/129 |
| 2006/0001779 A1 * | 1/2006 | Favrat | ................ | H04N 21/42638 348/725 |
| 2008/0143573 A1 * | 6/2008 | Luthra | ................ | H04L 27/265 341/155 |
| 2010/0067630 A1 * | 3/2010 | Gatta | ................ | H04N 21/4382 375/350 |
| 2010/0156690 A1 * | 6/2010 | Kim | ................ | H03M 1/12 341/155 |
| 2011/0055888 A1 * | 3/2011 | Clardy | ................ | H04N 21/4382 725/131 |
| 2013/0135983 A1 | 5/2013 | Gallagher et al. | | |
| 2013/0283322 A1 * | 10/2013 | Busson | ................ | H04L 27/06 725/68 |

* cited by examiner

METHOD AND SYSTEM FOR POWER MANAGEMENT IN A FREQUENCY DIVISION MULTIPLEXED NETWORK

CLAIM OF PRIORITY

This patent application is a continuation of U.S. patent application Ser. No. 14/015,481, now U.S. Pat. No. 9,049,491, which claims priority to U.S. provisional patent application Ser. No. 61/695,036 filed on Aug. 30, 2012, now expired.

The above-identified documents are hereby incorporated herein by reference in its entirety.

INCORPORATION BY REFERENCE

This patent application also makes reference to U.S. Patent Application Publication Serial No. 2014/0064420 titled "Method and System for Power Management in a Network Device Based on Multi-Protocol Detection" and filed on Aug. 28, 2013, which is hereby incorporated herein by reference in its entirety.

TECHNICAL FIELD

Aspects of the present application relate to communication networks. More specifically, to a method and system for power management in a Frequency Division Multiplexed Network.

BACKGROUND

Existing receivers in FDM networks (e.g., DOCSIS, MoCA) can consume too much energy. Further limitations and disadvantages of conventional and traditional approaches will become apparent to one of skill in the art, through comparison of such approaches with some aspects of the present method and system set forth in the remainder of this disclosure with reference to the drawings.

BRIEF SUMMARY

A method and/or system is provided for power management in a frequency division multiplexed network, substantially as illustrated by and/or described in connection with at least one of the figures, as set forth more completely in the claims.

DETAILED DESCRIPTION

As utilized herein the terms "circuits" and "circuitry" refer to physical electronic components (i.e., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting. Although various exemplary cable/DOCSIS embodiments are described herein, aspects of the invention are applicable to other networks which utilize frequency division multiplexing and/or are coordinated via management messages.

Figure 1A:
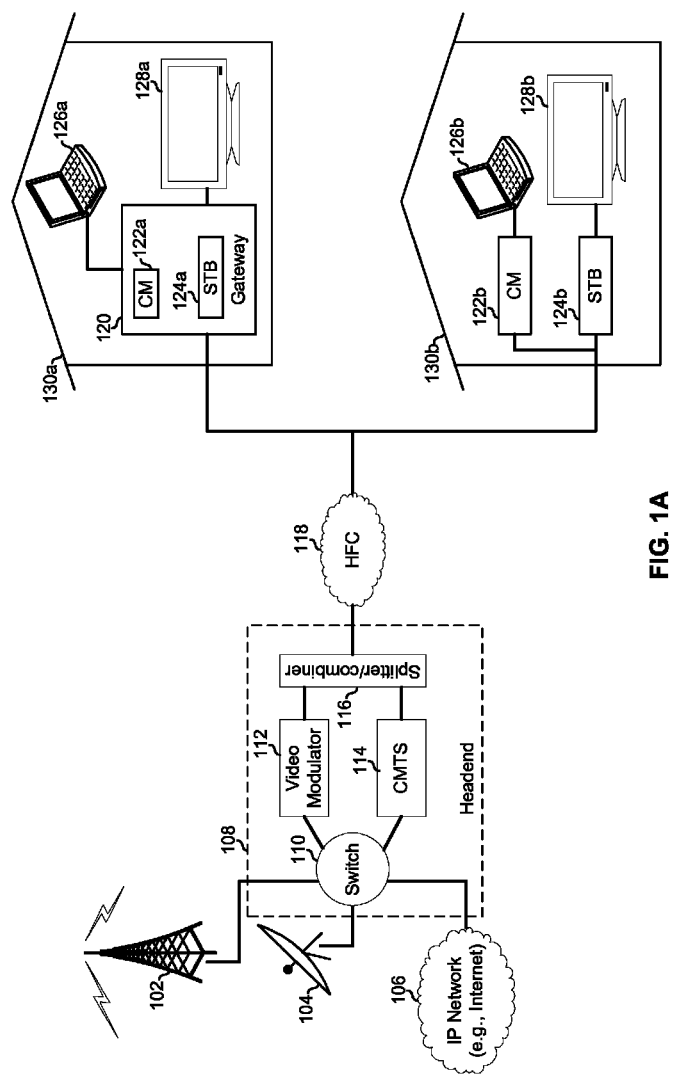
FIG. 1A depicts an example communication system in accordance with an example embodiment.

FIG. 1A depicts an example communication system in accordance with an example embodiment. Shown in FIG. 1 is a terrestrial television antenna 102, a satellite dish 104, an Internet Protocol (IP) network 106, a headend 108, a wide area network (e.g., hybrid fiber-coaxial (HFC) network) 118, a gateways 120a and 120b, end systems 126a and 126b (e.g., computers), and end systems 128a and 128b. The headend 108 comprises a switch 110, a video modulator 112, a cable modem termination system (CMTS) 114, and a splitter/combiner 116.

For downstream traffic, the headend 108 may receive television signals via the antenna 102 and the satellite dish 104, and may receive data via the IP network 106. The switch 110 may convey the television signals to the video modulator 112 and the data to the CMTS 114. The video modulator 112 may modulate the received television signals onto a carrier. The CMTS 114 may modulate the received data onto a carrier. The splitter/combiner 116 may combine the outputs of the video modulator 112 and the CMTS 114 resulting in a frequency division multiplexed (FDM) signal comprising one or more television channels and/or one or more DOCSIS channels. The FDM signal may be onto the wide area network (WAN) 118 for distribution to customer premise equipment (CPE). Each customer premise 130 may comprise one or more network devices operable to receive signals via the WAN 118, process the signals to recover content carried therein, and distribute the content to end systems such as computers 126, televisions 128, and/or the like. For example, customer premises 130a comprises a gateway with integrated cable modem 122a and set-top-box 124a. The cable modem 122a and the STB 124a may share an Rx front-end such as the Rx front-end 160 described below in FIG. 1B. As another example, customer premises 130b comprises cable modem 122b and set-top-box 124b implemented as separate devices.

The cable modem 122*b* and the STB 124*b* may each comprise an Rx front-end such as the Rx front-end 160 described below in FIG. 1B.

For upstream traffic, one or both of cable modem 122*a* and STB 124*b* and/or one or both of cable modem 122*b* and STB 124*b* may be operable to transmit, via a Tx front-end not shown, messages to the CMTS 114. For such upstream data, messages (e.g., network management/maintenance messages) may be modulated onto one or more carriers for transmission via the WAN 118. The splitter/combiner 116 may then convey the message to the CMTS 114. The CMTS 114 may process the messages and, in an example embodiment, adjust transmission parameters (e.g., modulation parameters, transmit power, frequency offsets, etc.) and/or perform other maintenance/management based on the received messages.

Figure 1B:
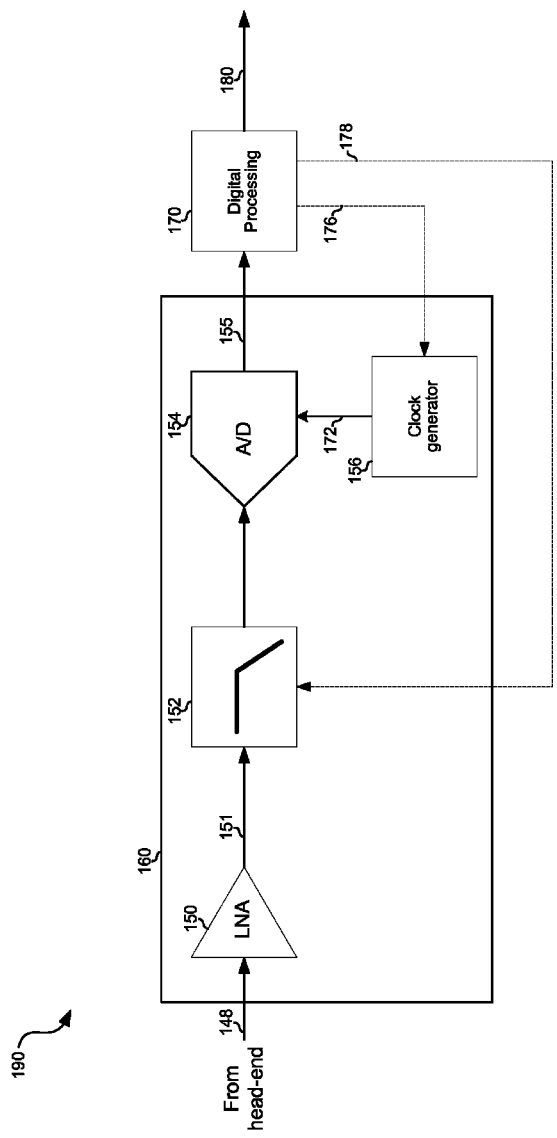
FIG. 1B depicts portions of an example network device operable to receive and process cable television/DOCSIS signals in accordance with an example implementation of this disclosure.

FIG. 1B depicts portions of an example network device operable to receive and process cable television/DOCSIS signals in accordance with an example implementation of this disclosure. The example device may be, for example, an implementation of the gateway 120, the cable modem 122*b*, or the STB 124*b*. The device comprises a receiver front-end 160 and digital processing circuitry 170. The front-end 160 comprises a low-noise amplifier (LNA) 150, a lowpass filter (LPF) 152, an analog-to-digital converter (ADC) 154, and a clock generator 156.

The LNA 150 may be operable to amplify signal 148 received via the WAN 118. The LNA 150 may be operable to amplify the signal 148 over a range of frequencies that encompasses frequency bands used by the applicable standard/protocol. For example, for a cable/DOCSIS network, the LNA 150 may be operable to amplify the range of frequencies ~50 MHz to ~1000 MHz shown in FIGS. 2A and 2B.

The filter 152 may be operable to selectively attenuate and/or amplify frequency sub-bands of the amplified signal 151. In an example implementation, the filter 152 is a low-pass filter which applies at least a threshold amount of attenuation (e.g., 3 dB) to frequencies above a cut-off frequency, $F_{CO}$. The cut-off frequency (or frequencies for a bandpass or multi-band filter) of the filter 152 may be preconfigured and/or tuned during runtime of the device in which the front-end 190 resides. The tuning of the filter 152 may be via a feedback loop and/or via one or more control signals (e.g., control signal 178 from digital processor 170).

Figure 2A:
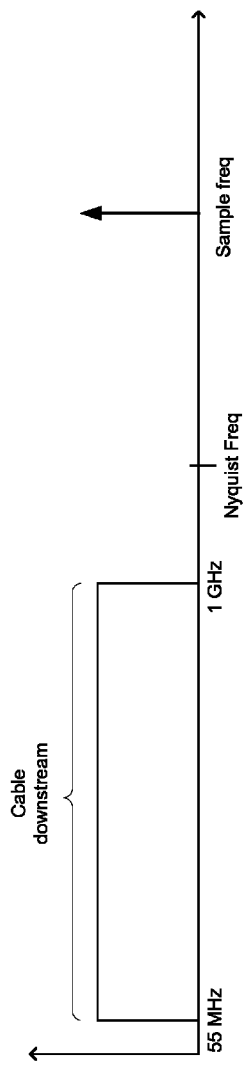
FIGS. 2A and 2B illustrate effect of sampling a cable downstream at different sampling frequencies.
Figure 2B:
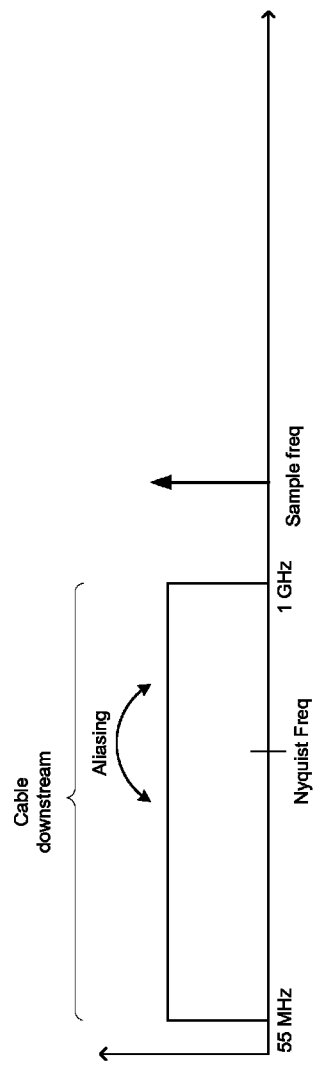

The analog-to-digital converter 154, may be operable to concurrently digitize signals over a range of frequencies that encompasses frequency bands used by multiple networks/protocols, such as the range of frequencies ~50 MHz to ~1550 MHz shown in FIGS. 2A and 2B. The sampling frequency used by the ADC 154 may be determined by the signal 172 from the clock generator 156.

The clock generator 156 may be operable to generate a clock signal 172 that oscillates at a frequency controlled by the digital processor 170 via control signal 176. The clock signal 172 may be, for example, a sinusoid or a square wave. The frequency clock signal 172 may controlled be via a feedback loop and/or via one or more control signals. (e.g., control signal 176 from digital processor 170).

The digital processor 170 may be operable to process (e.g., filter, demodulate, decode, etc.) the digitized signal 155 output by the ADC 154. The processor 170 may process the signal 155 to detect whether one or more channels of the digitized frequency band(s) need to be processed. When such channels do not need to be processed, the digital processor 170 may be operable to configure itself, and/or other components of the network device in which it resides, into a lower power mode of operation. A determination of whether or not certain channels are to be processed (e.g., demodulated, decoded, etc.) may be determined heuristically (e.g., based on a spectral analysis of the digitized signal, on past traffic patterns, etc.) and/or may be based on control messages (e.g., UCD, MAP, and/or other MAC management messages defined in DOCSIS standards) that the processor 170 monitors for in the digitized signal. For channels that are determined to need processing in the network device, the processor 170 may demodulate, decode, filter, and/or the like to recover data transmitted on the channel(s) and output the data as signal 180.

FIGS. 2A and 2B illustrate effect of sampling a cable downstream at different sampling frequencies. In FIG. 2A the sampling frequency is sufficiently high that the Nyquist frequency falls outside of the cable downstream spectrum. In this manner, portions of the cable spectrum do not fold onto itself during digital-to-analog conversion. In FIG. 2B, on the other hand, the Nyquist frequency falls within the cable spectrum such that it folds onto itself during digital-to analog conversion, thereby causing interference in the digitized signal.

Figure 3:
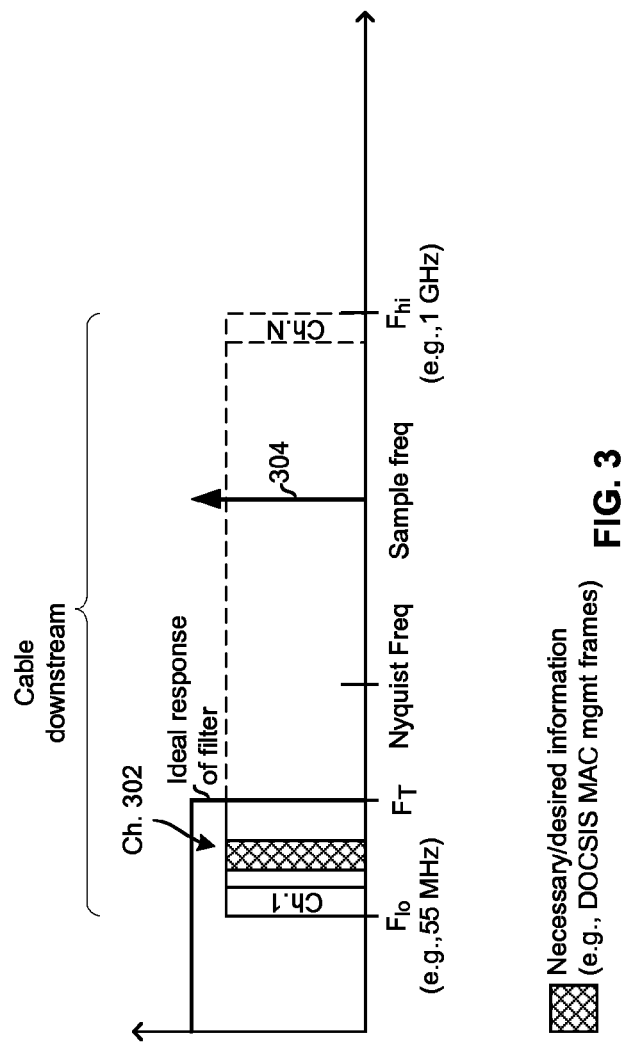
FIGS. 3 and 4 depict example low-power cable/DOCSIS sampling schemes in accordance with an example implementation.

FIG. 3 depicts an example low-power cable/DOCSIS sampling scheme in accordance with an example implementation of this disclosure. FIG. 3 shows a cable/DOCSIS system that uses single-carrier QAM channels for carrying downstream traffic. Each channel may be, for example, 6 or 8 MHz. The cable/DOCSIS band spans from $F_{lo}$ (e.g., 55 MHz) to $F_{hi}$ (e.g., 1000 MHz). Conventionally, any of the QAM channels in the cable/DOCSIS band may be selected as a DOCSIS downstream channel. Consequently, to ensure that the DOCSIS downstream channel can be sampled without aliasing problems, the sampling frequency is high-enough (e.g., $\sim 2*F_{hi}$) to account for the case where the highest possible downstream channel is chosen as the DOCSIS downstream channel. A drawback of this is that a higher sampling frequency typically corresponds to higher power consumption.

In an example implementation, selection of the DOCSIS downstream channel may be limited to channels below a determined threshold frequency $F_T$ (e.g., 150 MHz). The cut-off frequency, $F_{CO}$, of the low pass filter 152 may then be set to the threshold frequency (or far enough above the threshold frequency to allow for desired margin) as shown by the ideal filter response depicted in FIG. 3. Accordingly, since the receiving device (e.g., gateway 120 or cable modem 122*b*) knows (e.g., based on management messages, heuristics, hardware and/or software configuration, etc.) that the DOCSIS downstream will necessarily be below the threshold frequency, and that the filter is configured to prevent higher portions of the cable downstream from folding onto the desired channel 302, a relatively low sampling frequency 304 (e.g., relative to the ~2 GHz sampling frequency that would be needed to digitize channel N residing at ~1 GHz). The relatively low sampling frequency may be selected such that the Nyquist frequency falls at (or at a frequency just far enough above the threshold frequency to allow for desired margin) $F_T$. Use of the lower sampling frequency 304 may save considerable power in the receiving device.

In an example implementation, all downstream data may be restricted to transmission on channels below the threshold frequency. In another example implementation, only critical data (e.g., certain MAC management messages) may be restricted to channels below the threshold frequency while other data may be transmitted on downstream channels above the threshold frequency. In such an implementation, the non-critical data may or may not be received by a particular network device depending on how that device is configured (e.g., a device in a power saving mode may not be processing the downstream channel on which the non-critical data is received and, thus, may not receive the data).

Figure 4:
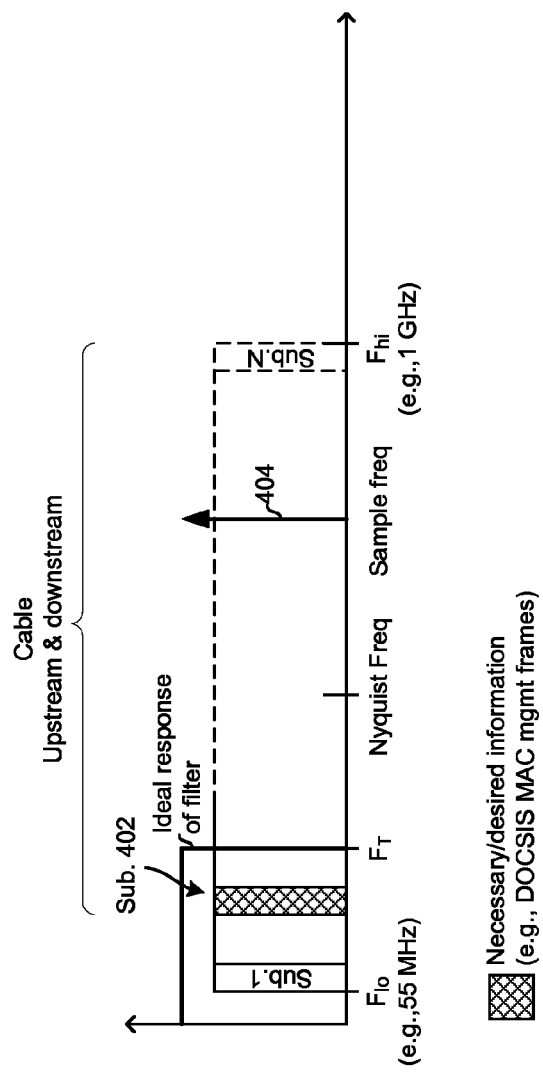

In FIG. 4, an example sampling technique in an OFDM system (e.g., a next-generation DOCSIS modem) is depicted. Each OFDM sub-band may comprise, for example, 20 to 50 KHz of bandwidth centered on a subcarrier frequency. In the example embodiment depicted, the network device (e.g., gateway 120 or cable modem 122b) may only need to receive MAC management messages (e.g., SYNC, UCD, and/or MAP messages). For example no end-systems connected to the receiver are requesting content. Accordingly, by limiting the sub-bands available for carrying such management messages to sub-bands that lie below a threshold frequency $F_T$, a relatively low sampling frequency 404 may be used (e.g., relative to the ~2 GHz sampling frequency that would be needed to digitize sub-band N in FIG. 4). The relatively low sampling frequency may be selected such that the Nyquist frequency falls at the threshold frequency $F_T$ (or at a frequency just far enough above the threshold frequency to allow for desired margin). The relatively low sampling frequency may result in lower power consumption. To prevent the lower sampling frequency from causing higher subcarriers from folding onto the desired subcarrier 402, the filter 152 may be configured to have its cut-off frequency, $F_{CO}$, set to $F_T$ (or slightly above $F_T$ to allow for desired margin).

Figure 5:
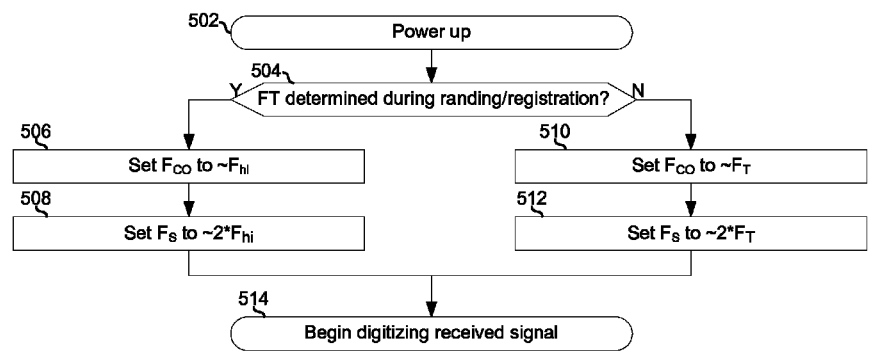
FIG. 5 is a flowchart illustrating an example process for configuring a receiver front-end in accordance with an example implementation of this disclosure

FIG. 5 is a flowchart illustrating an example process for configuring a receiver front-end in accordance with an example implementation of this disclosure. While the process is described with reference to gateway 120 for illustration, the process may be implemented in any network device. The process begins with block 602 in which gateway 120 powers up and establishes communications with a headend.

In block 504, during ranging/registration with the headend, the gateway 120 attempts to determine a frequency, $F_T$, that can be relied upon as the upper bound of channels used for communicating packets that the gateway 120 must necessarily receive. If the headend supports the restricting of necessary information (e.g., MAC management messages) to channels below a threshold frequency, and a value of the threshold frequency is communicated to gateway 120 during ranging/registration, then the process advances to block 510.

In block 510, the processor 170 of the gateway 120 sets the cut-off frequency of the filter 152 of the gateway 120 to $F_T$ plus desired/necessary margin.

In block 512, the processor 170 of the gateway 120 configures the clock generator 156 of the gateway 120 such that the frequency of the clock signal 172 is $2*F_T$ plus desired/necessary margin.

In block 514, the ADC 154 of the gateway 120 begins digitizing the signal received from the headend.

Returning to block 504, if $F_T$ cannot be determined (e.g., because restricting necessary info to channels below a threshold frequency is not supported by the headend), then the process advances to block 506.

In block 506, the processor 170 of the gateway 120 sets the cut-off frequency of the filter 152 of the gateway 120 to $F_{hi}$ plus desired/necessary margin.

In block 508, the processor 170 of the gateway 120 configures the clock generator 156 of the gateway 120 such that the frequency of the clock signal 172 is $2*F_{hi}$ plus desired/necessary margin.

Figure 6:
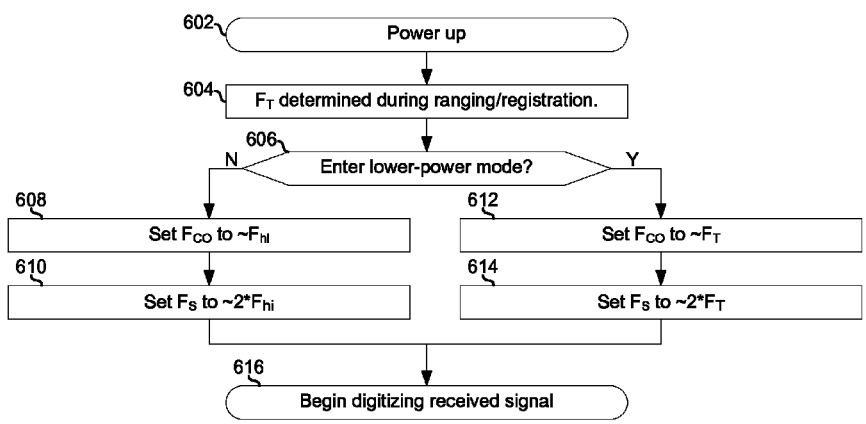
FIG. 6 is a flowchart illustrating an example process for configuring a receiver front-end in accordance with an example implementation of this disclosure.

FIG. 6 is a flowchart illustrating an example process for configuring a receiver front-end in accordance with an example implementation of this disclosure. While the process is described with reference to gateway 120 for illustration, the process may be implemented in any network device. The process begins with block 602 in which gateway 120 powers up and establishes communications with a headend.

In block 604, the value of a threshold frequency, $F_T$, to be used as the upper limit for communications to network devices operating in a lower power mode is determined. The gateway 120 may negotiate the threshold frequency or may simply be informed of a threshold frequency determined by the headend. In an example implementation, block 604 may take place during, for example, ranging/registration in a DOCSIS network.

In block 606, the gateway 120 determines whether to enter a lower-power mode. As an example, the gateway 120 may enter a lower-power mode when, for example, the computer 126a is not requesting any downstream data and when the television 128a is not consuming any content transmitted on a channel having a frequency above $F_T$. If the device determines to enter a lower-power, then the process advances to block 608.

In block 612, the processor 170 of the gateway 120 sets the cut-off frequency of the filter 152 of the gateway 120 to $F_T$ plus desired/necessary margin.

In block 614, the processor 170 of the gateway 120 configures the clock generator 156 of the gateway 120 such that the frequency of the clock signal 172 is $2*F_T$ plus desired/necessary margin.

In block 616, the ADC 154 of the gateway 120 begins digitizing the signal received from the headend.

Returning to block 606, if the gateway 120 decides not to enter a low power mode (e.g., because the front end is shared between the CM 122a and the STB 124b, and the television 128a is requesting data from a channel that is transmitted above $F_T$), them the process advances to block 608.

In block 608, the processor 170 of the gateway 120 sets the cut-off frequency of the filter 152 of the gateway 120 to $F_{hi}$ plus desired/necessary margin.

In block 610, the processor 170 of the gateway 120 configures the clock generator 156 of the gateway 120 such that the frequency of the clock signal 172 is $2*F_{hi}$ plus desired/necessary margin.

Figure 7:
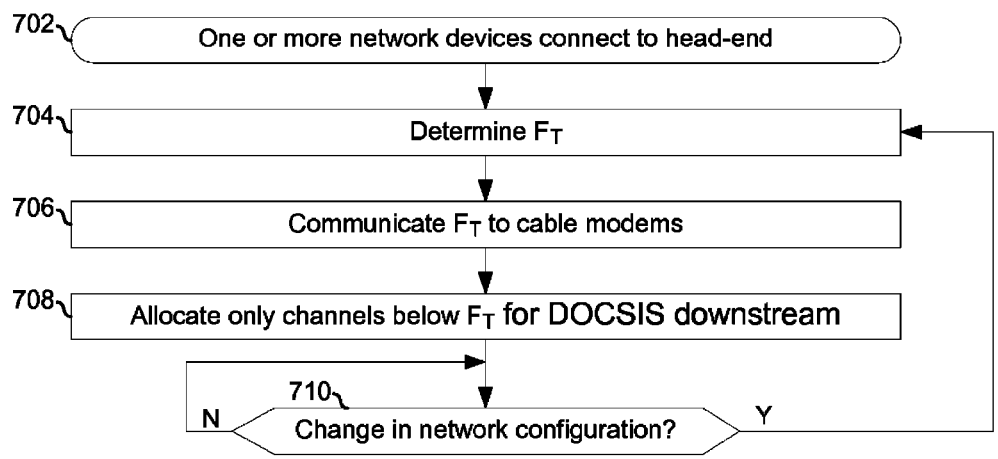
FIG. 7 is a flowchart illustrating an example process implemented by a headend that supports power reduction in customer premise devices.

FIG. 7 is a flowchart illustrating an example process implemented by a CMTS that supports power reduction in customer premise devices. In block 702, one or more network devices, such as gateway 120 and cable modem 122b, establish communications with the CMTS.

In block 704, the CMTS determines a threshold frequency $F_T$. The determination of $F_T$ may be based, for example, on how many devices are served by the headend, a level of service (e.g., based on type of subscription) to be provided to the network devices, and/or the like. For example, where many devices are served by the CMTS, a higher $F_T$ may need to be chosen to provide more bandwidth available for allocation to one or more DOCSIS downstream channels, whereas fewer devices may permit a lower $F_T$ and correspondingly less bandwidth available to be allocated to one or more DOCSIS downstream channels.

In block 706, the determined value of $F_T$ may be communicated to the network device served by the CMTS, such that the network devices can set their sampling frequencies accordingly.

In block 708, communications between the CMTS and the network devices take place. In planning these communications, the headend restricts downstream bandwidth allocations to channels below $F_T$.

In block 710, if there is a change in the network configuration (e.g., new network device registers with the CMTS), the process returns to block 704 and a new value of $F_T$ (which may be the same as the previous value) is determined.

In an example implementation of this disclosure, a network device (e.g., gateway 120 or cable modem 122b) may receive a signal from a headend (e.g., cable television/DOCSIS headend 108), wherein a bandwidth of the received signal spans from a low frequency (e.g., $F_{lo}$ in FIG. 3) to a high frequency (e.g., $F_{hi}$ in FIG. 3) and encompasses a plurality of sub-bands (e.g., channels 1 through N in FIG. 3 or sub-bands 1 through N in FIG. 4). The network device may determine, based on communication with the headend (e.g., during ranging/registration and/or through MAC management messages), whether one of more of the sub-bands residing above a threshold frequency (e.g., channels above $F_T$ in FIG. 3 or sub-bands above $F_T$ in FIG. 4) are available for carrying downstream data from the headend to the circuitry. The network device may digitize the signal using an analog-to-digital converter (ADC) (e.g., 154) operating at a sampling frequency. The sampling frequency may be configured based on a result of the determining. When the one or more sub-bands are available for carrying downstream data from the headend to the network device, the sampling frequency may be set to a frequency that is at least twice the high frequency. When the one or more sub-bands are not available for carrying downstream data from the headend to the network device, the sampling frequency may be set equal to or substantially equal to (e.g., within a determined tolerance or error margin of) to the threshold frequency. When the one or more sub-bands are available for carrying downstream data from the headend to the network device, the sampling frequency may be set to a relatively high frequency. When the one or more sub-bands are not available for carrying downstream data from the headend to the network device, the sampling frequency may be set to a relatively low frequency.

Continuing with the example implementation, the network device may comprise a filter (e.g., 152) which may filter the received signal prior to the digitizing. The network device may configure a cut-off frequency the filter based on the result of the determining. When the one or more sub-bands are available for carrying downstream data from the headend to the network device, the cut-off frequency of the filter may be set to a frequency that is at least twice the high frequency. When the one or more sub-bands are not available for carrying downstream data from the headend to the network device, the cut-off frequency of the filter may be set to a frequency equal to or substantially equal to (e.g., within a determined tolerance or error margin of) the threshold frequency. When the one or more sub-bands are available for carrying downstream data from the headend to the network device, the cut-off frequency may be set to a relatively high frequency. When the one or more sub-bands are not available for carrying downstream data from the headend to the network device, the cut-off frequency may be set to a relatively low frequency.

In an example implementation of this disclosure, a cable modem (e.g., 122b) may be coupled to a cable modem termination system (CMTS) (e.g., 114) and may comprise an analog-to-digital converter (ADC) (e.g., 154) for digitizing signals from the CMTS. The cable modem may determine (e.g., based on communications with the CMTS) that only a portion of all sub-bands (e.g., channels 1 through N in FIG. 3 or OFDM sub-bands 1 through N in FIG. 4) in the DOCSIS frequency band (e.g., from ~55 MHz to ~1 GHz) are available for communication of DOCSIS downstream data from the CMTS to the cable modem, and that the portion of the sub-bands reside below a threshold frequency (e.g., $F_T$ in FIG. 3 or FIG. 4). In response to the determination, the cable modem may configure a sampling frequency of the ADC to be equal to or substantially equal to the threshold frequency. The cable modem may digitize a signal received from the CMTS using the configured sampling frequency. The cable modem may comprise a filter (e.g., 152) for processing signals from the CMTS and may configure a cut-off frequency of the filter to be equal to or substantially equal to (e.g., within a determined tolerance or error margin of) the threshold frequency. Prior to the digitizing of the signal from the CMTS, the cable mode may filter the signal using the configured filter.

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for power management in a frequency division multiplexed network.

Accordingly, the present method and/or system may be realized in hardware, software, or a combination of hardware and software. The present method and/or system may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising:
   an analog-to-digital converter operable to digitize a signal received from a headend;
   a digital processing circuit operable to:
      determine, based on signals received from said headend, which one or more of a plurality of sub-bands are available for carrying data from said headend to said cable modem; and
      control a sampling frequency of said analog-to-digital converter such that:
         when one or more of said plurality of sub-bands that are above a particular threshold frequency are available for carrying data from said headend to said cable modem, said sampling frequency is set to a frequency that is twice a highest frequency of said one or more of said plurality of sub-bands that are above said particular threshold; and when said one or more of said plurality of sub-bands that are above a particular threshold are not available for carrying data from said headend to said cable modem, said sampling frequency is set to a frequency that is at least twice said particular threshold frequency.

2. The system of claim 1, comprising a filter operable to filter said signals received from said headend prior to said digitization of said signals by said analog-to-digital converter.

3. The system of claim 2, wherein a frequency response of said filter is configurable during runtime of said system.

4. The system of claim 2, wherein:

when one or more of said plurality of sub-bands that are above a particular threshold frequency are available for carrying data from said headend to said cable modem, a cut-off frequency of said filter is set to a frequency that is twice a highest frequency of said one or more of said plurality of sub-bands that are above said particular threshold; and when said one or more of said plurality of sub-bands that are above a particular threshold are not available for carrying data from said headend to said cable modem, said cut-off frequency of said filter is set to a frequency that is at least twice said particular threshold frequency.

5. The system of claim 1, wherein said data consists of management messages.

6. The system of claim 5, wherein said management message comprise one or more of: a DOCSIS SYNC message, a DOCSIS UCD message, and a DOCSIS MAP message.

7. The system of claim 1, wherein said digital processing circuit is operable to negotiate said particular threshold frequency with said headend.

8. The system of claim 1, wherein said digital processing circuit is operable to determine said particular threshold frequency based on communications from said headend.

9. A system comprising:

an analog-to-digital converter operable to digitize a signal received from a headend;

a digital processing circuit operable to:

determine, based on signals received from said headend, which one or more of a plurality of sub-bands are available for carrying management messages from said headend to said cable modem, wherein for a first network configuration said management messages are restricted to one of more of said plurality of sub-bands below a particular threshold frequency, and for a second network configuration one or more of said plurality of sub-bands above said particular threshold frequency are available for carrying said management messages, and control a sampling frequency of said analog-to-digital converter such that:

for said first network configuration, said sampling frequency is set to a frequency that is at least twice said particular threshold frequency; and for said second network configuration, said sampling frequency is set to a frequency that is at least twice a highest frequency of said plurality of sub-bands.

10. The system of claim 9, comprising a filter operable to filter said signals received from said headend prior to said digitization of said signals by said analog-to-digital converter.

11. The system of claim 9, wherein a frequency response of said filter is configurable during runtime of said system.

12. The system of claim 9, wherein:

for said first network configuration, a cut-off frequency of said filter is set to a frequency that is at least twice said particular threshold frequency; and for said first network configuration, said cut-off frequency of said filter is set to a frequency that is at least twice a highest frequency of said plurality of sub-bands.

13. The system of claim 5, wherein said management messages comprise one or more of: a DOCSIS SYNC message, a DOCSIS UCD message, and a DOCSIS MAP message.

14. The system of claim 9, wherein said digital processing circuit is operable to negotiate said particular threshold frequency with said headend.

15. The system of claim 9, wherein said digital processing circuit is operable to determine said particular threshold frequency based on communications from said headend.

* * * * *